United States Patent
Hong et al.

(10) Patent No.: US 8,384,010 B2
(45) Date of Patent: Feb. 26, 2013

(54) LIGHT DETECTION-TYPE TOUCH SENSING APPARATUS

(75) Inventors: Won-ki Hong, Suwon-si (KR); Jeehong Min, Yongin-si (KR); Moongyu Lee, Suwon-si (KR); Seungho Nam, Seongnam-si (KR); Youngchan Kim, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 460 days.

(21) Appl. No.: 12/707,326

(22) Filed: Feb. 17, 2010

(65) Prior Publication Data

US 2011/0068256 A1    Mar. 24, 2011

(30) Foreign Application Priority Data

Sep. 18, 2009 (KR) .................. 10-2009-0088678

(51) Int. Cl.
  *G06M 7/00* (2006.01)
  *G06F 3/042* (2006.01)
(52) U.S. Cl. ..................... 250/221; 345/175
(58) Field of Classification Search .............. 250/221; 345/173, 175, 176
See application file for complete search history.

(56) References Cited

U.S. PATENT DOCUMENTS 7,034,809 B2 * 4/2006 Hasegawa ............. 345/173
2005/0248540 A1 * 11/2005 Newton ................. 345/173

FOREIGN PATENT DOCUMENTS

| JP | 05-080935 | 4/1993 |
| JP | 2005-165830 | 6/2005 |
| KR | 10-1990-0000088 | 1/1990 |
| KR | 10-0868824 | 11/2008 |

OTHER PUBLICATIONS

English Abstract for Publication No. 10-1990-0000088, 1990.
English Abstract for Publication No. 05-080935, 1993.
English Abstract for Publication No. 2005-165830, 2005.
English Abstract for Publication No. 1020080096974 (for 10-0868824), 2008.

* cited by examiner

*Primary Examiner* — Thanh Luu
(74) *Attorney, Agent, or Firm* — F. Chau & Associates, LLC

(57) ABSTRACT

A touch sensing apparatus includes a light source generating a light. The light travels though a light distribution part. A light guide part guides the light to the light distribution part. A light sensing part outputs an output signal corresponding to an intensity of the light incident through the light guide part and the light distribution part when a touch occurs. A light reflection part reflects the light provided to the light distribution part, and a coordinate generating part calculates a coordinate value of the touch using the output signal from the light sensing part.

20 Claims, 13 Drawing Sheets

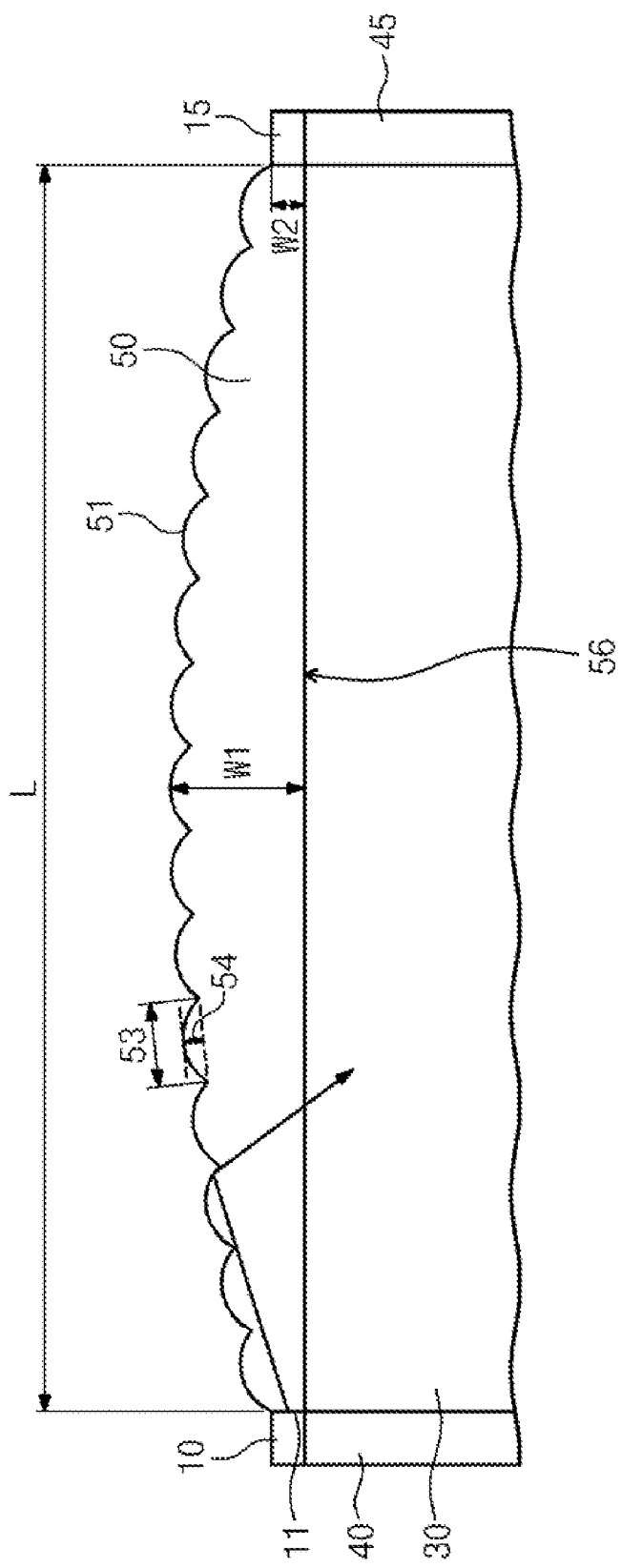

LIGHT DETECTION-TYPE TOUCH SENSING APPARATUS

CROSS-REFERENCE TO RELATED APPLICATION

This application claims priority to Korean Patent Application No. 10-2009-0088678 filed on Sep. 18, 2009, the contents of which are herein incorporated by reference in its entirety.

BACKGROUND

1. Technical Field

The present invention relates to a touch sensing apparatus. More particularly, the present invention relates to a touch sensing apparatus having a simplified structure and a reduced manufacturing cost.

2. Discussion of the Related Art

Touch sensing apparatuses are input/output devices that are capable of sensing the physical touch of a user and interpreting characteristics of the physical touch so that the user may more easily provide input to a computerized device. Touch sensing apparatuses may either be combined with a display device, in which case they are classified as touch screens, or may lack a display device, in which case they are classified as touch pads. Touch sensing apparatuses may also be classified in terms of the sensing technology that they employ. For example, touch sensing apparatuses may be classified as resistance type touch sensing apparatus, surface wave-type touch sensing apparatus, or light detection type touch sensing apparatus.

The resistance type touch sensing apparatus senses a variation of current corresponding to an external touch. The surface wave-type touch sensing apparatus senses variations of supersonic waves corresponding to the external touch. The light detection type touch sensing apparatus uses a light emitting device and a light receiving device to sense a variation of an intensity of light supplied to the light receiving device as the external touch has a tendency to block the quantity of light that is received by the light receiving device.

SUMMARY

Exemplary embodiments of the present invention provide a touch sensing apparatus having a simplified structure and a reduced manufacturing cost.

According to exemplary embodiments of the present invention, a touch sensing apparatus includes at least one light source generating light, a light distribution part in which the light from the light source is distributed, a light guide part that guides the light from the light source to the light distribution part, a light sensing part, a light reflection part, and a coordinate generating part. The light sensing part faces the light guide part. The light distribution part is interposed between the light sensing part and the light guide part. The light sensing part receives the light provided through the light guide part and the light distribution part from the light source and outputs an output signal corresponding to an amount of the light varied corresponding to a first touch occurring in the light distribution part. The light reflection part defines the light guide part in association with the light guide part and the light sensing part and reflects the light to the light distribution part. The coordinate generating part calculates a coordinate value of the first touch using the output signal from the light sensing part.

According to exemplary embodiments of the present invention, a touch sensing apparatus includes at least one light source that generates a light, a light guide part, a light sensing part, a light guide plate, and a coordinate generating part. The light guide part receives the light from the light source and changes a path of the light from the light source and the light sensing part faces the light guide part and outputs an output signal corresponding to an amount of the light. The light guide plate is disposed between the light guide part and the light sensing part and guides the light to the light sensing part, which is provided from the light source through the light guide part. The coordinate generating part calculates a coordinate value of a touch occurring on the light guide plate in response to the output signal that is generated corresponding to the touch.

According to the above, light guide patterns formed with the light guide part guide the light generated by the light source to the light sensing devices. The light guide patterns may serve as the light source to provide the light to the light sensing devices. Thus, fewer light sources need be used for the touch sensing apparatus and a structure of the touch sensing apparatus may be simplified. In addition, the touch sensing apparatus may calculate coordinate values of multi-touches occurring in the light distribution part.

BRIEF DESCRIPTION OF THE DRAWINGS

The above and other aspects of exemplary embodiments of the present invention will become readily apparent by reference to the following detailed description when considered in conjunction with the accompanying drawings wherein:

FIG. 2A is a partially enlarged view of the touch sensing apparatus of FIG. 1;

DETAILED DESCRIPTION OF THE EXEMPLARY EMBODIMENTS

It will be understood that when an element or layer is referred to as being "on", "connected to" or "coupled to" another element or layer, it can be directly on, connected or coupled to the other element or layer or intervening elements or layers may be present.

Hereinafter, exemplary embodiments of the present invention will be explained in detail with reference to the accompanying drawings.

Figure 1:
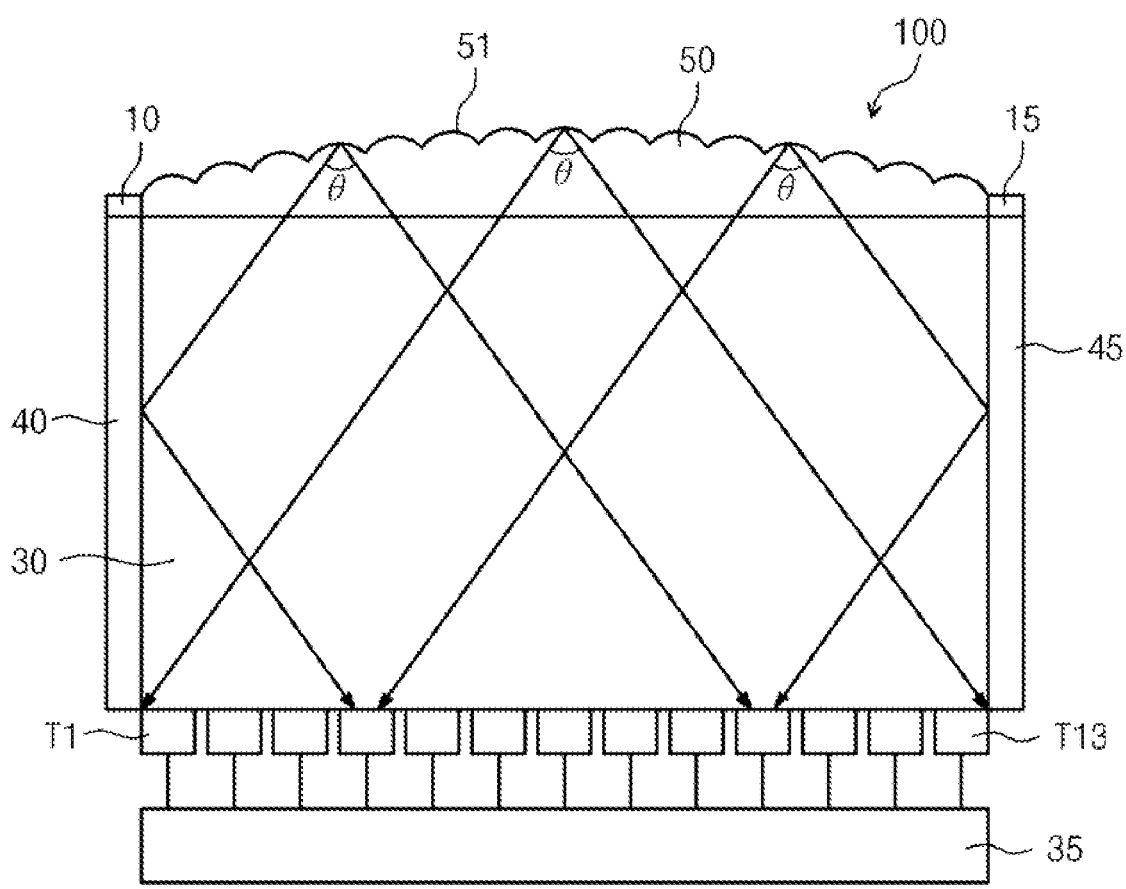
FIG. 1 is a plan view showing a touch sensing apparatus according to an exemplary embodiment of the present invention.
Figure 2B:
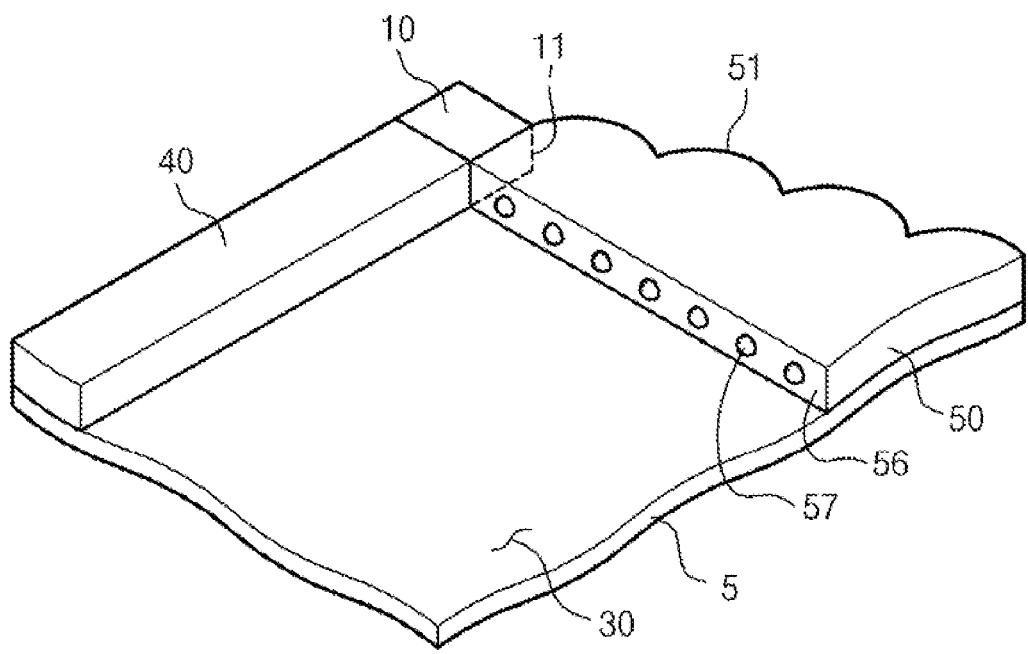
FIG. 2B is a perspective view of the touch sensing apparatus of FIG. 2A.

FIG. 1 is a plan view showing a touch sensing apparatus according to an exemplary embodiment of the present invention. FIG. 2A is a partially enlarged view of the touch sensing apparatus of FIG. 1. FIG. 2B is a perspective view of the touch sensing apparatus of FIG. 2A.

Referring to FIGS. 1, 2A, and 2B, a touch sensing apparatus 100 may be a light detecting type touch sensing apparatus that senses a variation of the intensity of light resulting from an external touch and detects a position of the touch on the touch sensing apparatus 100 based on the sensed variation of the intensity of light.

The touch sensing apparatus 100 includes a first light source 10, a second light source 15, a light distribution part 30, a first light reflection part 40, a second light reflection part 45, a light guide part 50, a light sensing part including light sensing devices T1 through T13, and a coordinate generating part 35.

The first and second light sources 10 and 15 generate light used to sense the touch position by the touch sensing apparatus 100. Each of the first and second light sources 10 and 15 includes a light emitting surface 11 facing the light guide part 50. Each of the first and second light sources 10 and 15 may include, for example, one or more light emitting diodes.

The light distribution part 30 is a space in which the light generated by the first and second light sources 10 and 15 are distributed. The light distributed in the light distribution part 30 travels to the light sensing devices T1 through T13 from the light guide part 50. The light distribution part 30 may be defined by the light guide part 50, the first and second light reflection parts 40 and 45, the light sensing devices T1 through T13, and a plate 5 disposed under the light distribution part 30.

When a touch occurs in the fight distribution part 30, the touch sensing apparatus 100 senses the position of the touch. Accordingly, if a display apparatus employs the touch sensing apparatus 100, for example, as part of a touch-screen device, the light distribution part 30 may coincide with the display area of the display apparatus, as observed in a plan view.

The light guide part 50 may include a plastic such as polymethylmethacrylate (PMMA) having a superior light transmittance and a refractive index higher than the refractive index of air. The light guide part 50 is disposed at an upper side of the touch sensing apparatus 100 and is positioned between the first and second light sources 10 and 15. In addition, a first side of the light guide part 50 makes contact with the light emitting surface 11 of the first light source 10 and the light generated by the first light source 10 may travel to the light guide part 50. Similarly, a second side of the light guide part 50, which is opposite to the first side, makes contact with the light emitting surface 11 of the second light source 15 and the light generated by the second light source 15 may travel to the light guide part 50.

In addition, the light guide part 50 includes an exiting surface 56 and the light generated by the first and second light sources 10 and 15 travels to the light distribution part 30 through the exiting surface 56. The light guide part 50 includes a plurality of light guide patterns 51 arranged at a surface opposite to the exiting surface 56. Each of the light guide patterns 51 changes a path of the light from the first and second light sources 10 and 15 such that the light from the first and second light sources 10 and 15 travel to the light distribution part 30. Since the light from the first and second light sources 10 and 15 travel to the light distribution part 30 by the light guide patterns 51, an effect may be created similar to that caused by an array of light sources arranged corresponding to the light sensing devices T1 through T13.

The light guide part 50 may have a plate-like shape with a thickness of about 0.6 millimeters. Each of the light guide patterns 51 has a height 54 of about 34 micrometers to about 45 micrometers and has a pitch of about 150 micrometers. In addition, each of the light guide patterns 51 may have an arch shape. In detail, in the light guide part 50, a third side making contact with the light distribution part 30 has a straight shape, a fourth side opposite to the third side has a round shape, and a width gradually decreases from a center of the light guide part 50 to the first and second sides of the light guide part 50. For example, if the light guide part 50 has a length of about 38 millimeters, the light guide part 50 may have a maximum width W1 of about 8 millimeters and a minimum width W2 of about 2.7 millimeters. Thus, the light emitting surface I1 may have a rectangular shape that is defined by a long side having a length substantially the same as the minimum width W2 and a short side having a length substantially the same as a thickness of the light guide part 50.

In addition, the light guide part 50 may further include a plurality of protrusion patterns 57 protruding from the exiting surface 56. Each of the protrusion patterns 57 may condense the light by acting as a convex lens. Thus, the protrusion patterns 57 may prevent the light exiting through the exiting surface 56 from being scattered upward of the light distribution part 30. In FIG. 2B, each of the protrusion patterns 57 has a semi-circular shape, but it is to be understood that the invention is not limited thereto or thereby. For example, each of the protrusion patterns 57 may have a semi-column shape.

Meanwhile, the light is guided to the light distribution part 30 by the light guide part 50 and exits from the light guide part 50 at a single angle. Particularly, the light being reflected from the light guide patterns 51 and traveling to the light distribution part 30 has the same exit angle $\theta$ with respect to the exiting surface 56 regardless of where on the light distribution part 30 the light exits. Accordingly, the distribution of the light may be uniform over the entire light distribution part 30.

The light sensing devices T1 through T13 are located at positions facing the light guide part 50 while the light distribution part 30 is interposed between the light guide part 50 and the light sensing devices T1 through T3. The light sensing devices T1 through T13 include first to thirteenth light sensing devices T1 through T13. The light sensing devices T1 through T13 sense the light provided from the first and second light sources 10 and 15 and generate output signals corresponding to the amount of the sensed light.

Each light sensing device may be a photodiode or a phototransistor and may convert light energy to an electrical signal. In addition, thirteen light sensing devices T1 through T13 have been shown in FIG. 1, but the number of the light sensing devices should not be limited thereto.

The first light reflection part 40 is disposed substantially between the first side of the first light source 10 and the first light sensing device T1 and the second light reflection part 45 is disposed substantially between the second side of the second light source 15 and the thirteenth light sensing device T13, thereby defining the light distribution part 30. The first and second light reflection parts 40 and 45 regularly reflect the light guided by the light guide part 50.

The coordinate generating part 35 calculates a coordinate value of the touch position using the output signals output from the light sensing devices T1 through T13 when the touch occurs in the light distribution part 30. The calculation operation of the coordinate generating part 35 will be described in detail with reference to FIGS. 3A to 8B.

Figure 3A:
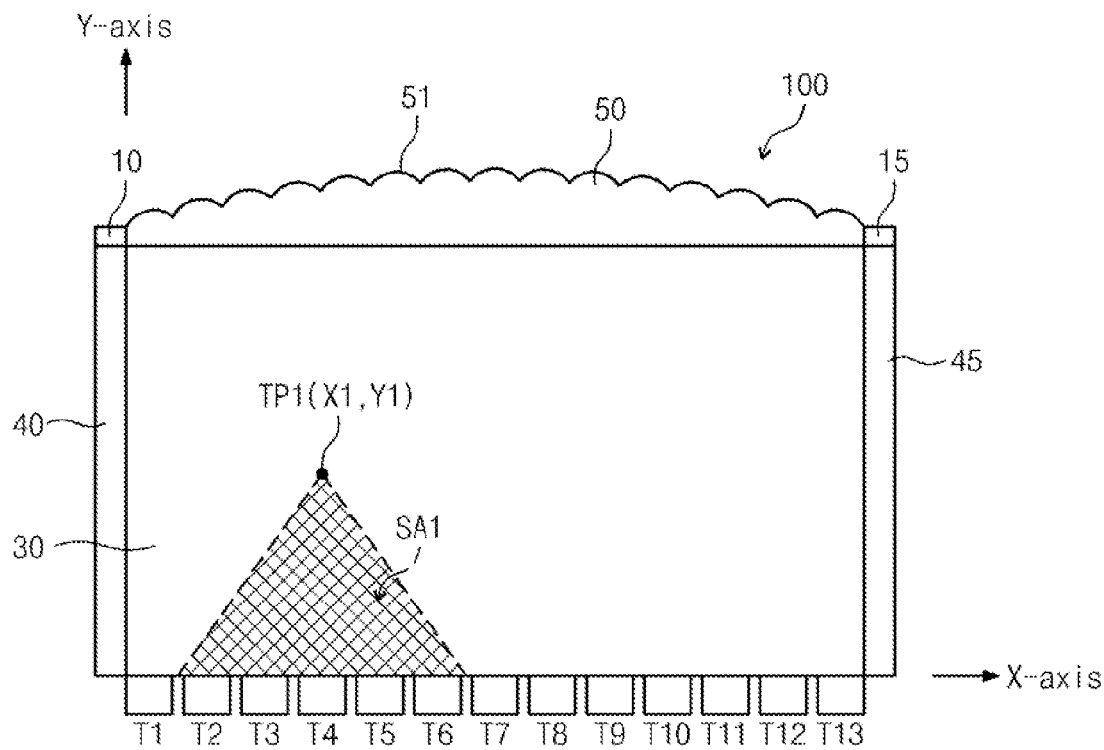
FIGS. 3A and 3B are views illustrating a calculation process of X and Y coordinates of a first touch using a touch sensing apparatus.
Figure 3B:
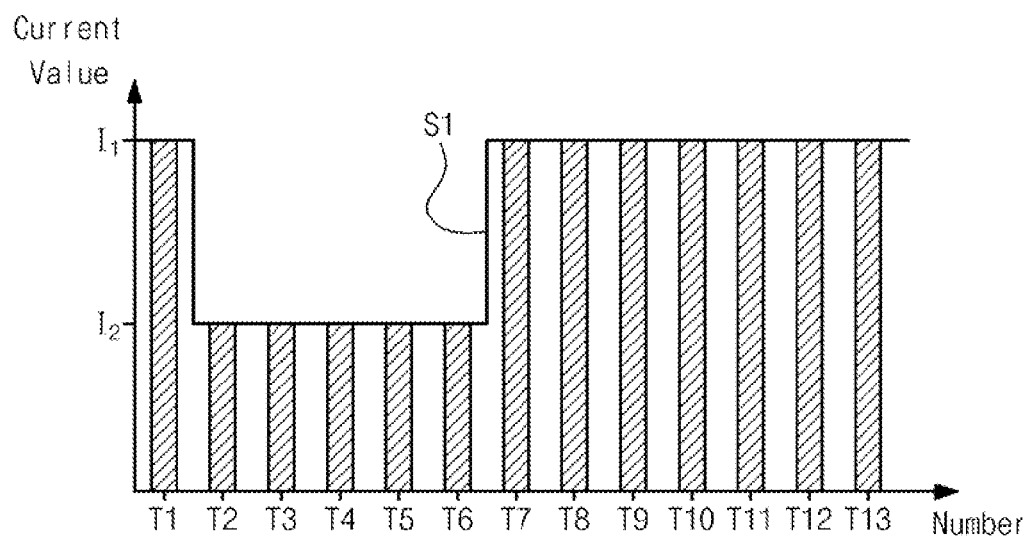

FIGS. 3A and 3B are views illustrating a calculation process of X and Y coordinates of a first touch using a touch sensing apparatus. Particularly, FIG. 3A shows a first touch occurring at a position in the light distribution part 30 and FIG. 3B shows the output signals output from the first to thirteenth light sensing devices T1 through T13 in response to the first touch.

Referring to FIGS. 3A and 3B, when the first touch TP1 occurs in the light distribution part 30, a first shadow area SA1 of which the touch position of the first touch TP1 is defined as a vertex is generated since the light being reflected by each of the light guide patterns 51 and traveling to the light distribution part 30 have the exit angle θ with respect to the exit surface 56. The first shadow area SA1 has an intensity of light less than that of an area surrounding the first shadow area SA1. Since the first shadow area SA1 is generated, a second current value I2 output from each of the second, third, fourth, fifth, and sixth light sensing devices T2, T3, T4, T5, and T6 is smaller than a first current value I1 output from each of the first, seventh, eighth, ninth, tenth, eleventh, twelfth, and thirteenth light sensing devices T1, T7, T8, T9, T10, T11, T12, and T13

Accordingly, the coordinate generating part 35 receives a first output signal S1 output from each of the first to thirteenth light sensing devices T1 through T13 and groups the second to sixth light sensing devices T2 through T6, each from which the second current value I2 is output, into one light sensing device group. Then, the coordinate generating part 35 outputs a center value of X-axis direction corresponding to the light sensing device group as an X-axis coordinate value X1 of the first touch TP1.

In addition, based on the first output signal S1, the coordinate generating part 35 may obtain the number of the light sensing devices of the light sensing device group and a variation of the current value from each light sensing device of the light sensing device group to output a Y-axis coordinate value Y1 of the first touch TP1.

In detail, as the touch position of the first touch TP1 is closed to the light sensing devices T1 through T13, the area of the first shadow area SA1 generated by the first touch TP1 decreases. Thus, the number of the light sensing devices that outputs the second current value I2 reduced by the first shadow SA1 decreases in the light sensing device group. As the touch position of the first touch TP1 is farther from the light sensing devices T1 through T13, the area of the first shadow area SA1 generated by the first touch TP1 increases. Thus, the number of the light sensing devices that outputs the second current value I2 reduced by the first shadow SA1 increases in the light sensing device group.

In addition, as the touch position of the first touch TP1 is closer to the light sensing devices T1 though T13, the intensity of light provided to the light sensing devices T1 through T13 that is blocked by the first touch TP1 increases. Thus, as the touch position of the first touch TP1 is closer to the light sensing devices T1 through T13, the number of the light sensing devices that outputs the second current value I2 reduced by the first shadow SA1 decreases in the light sensing device group and the second current value I2 is more reduced.

For example, before the first touch TP1 occurs, each of the first to thirteenth light sensing devices T1 though T13 outputs the first current value I1, however each of the second to sixth light sensing devices T2 through T6 outputs the second current value I2 smaller than the first current value I1 after the first touch TP1 occurs. Here, the number of the light sensing devices that outputs the second current value I2 in response to the first touch TP1 is five and a first variation of the current value output from each of the five light sensing devices is the same as a value obtained by subtracting the second current value I2 from the first current value I1.

Accordingly, the coordinate generating part 35 may calculate the Y-axis coordinate Y1 of the first touch TP1 based on the number of the light sensing devices that outputs the second current value I2 in response to the first touch TP1 and the first variation of the current value output from each of the light sensing devices that output the second current value I2.

Figure 4A:
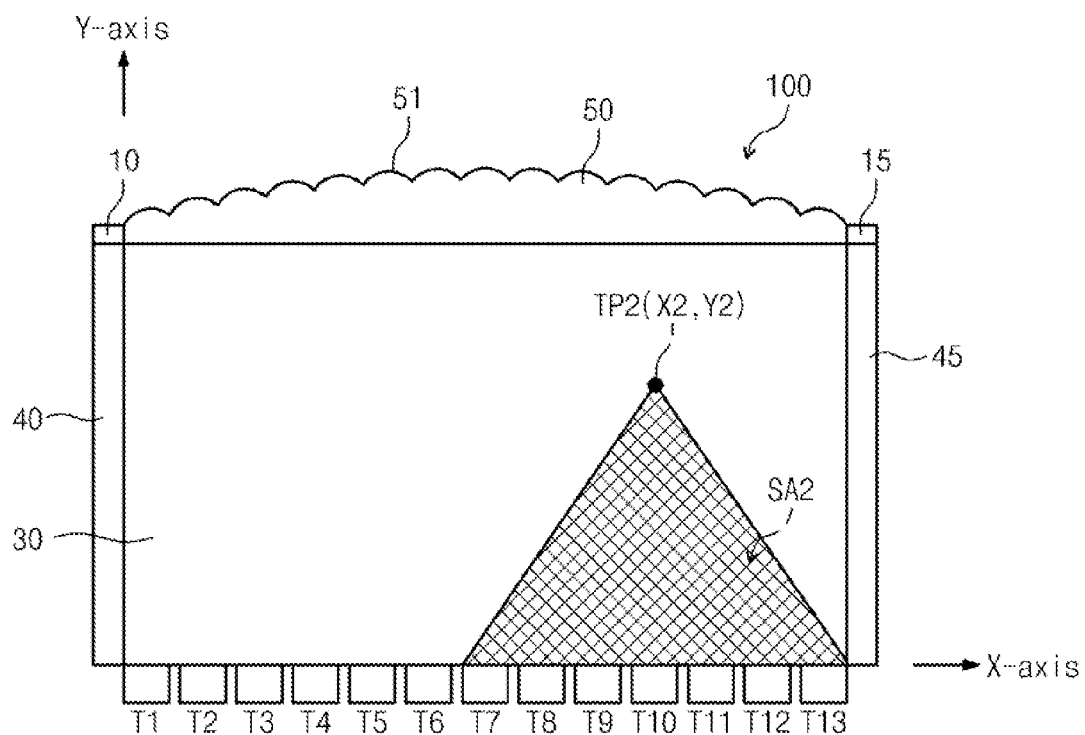
FIGS. 4A and 4B are views illustrating a calculation process of X and Y coordinates of a second touch using a touch sensing apparatus.
Figure 4B:
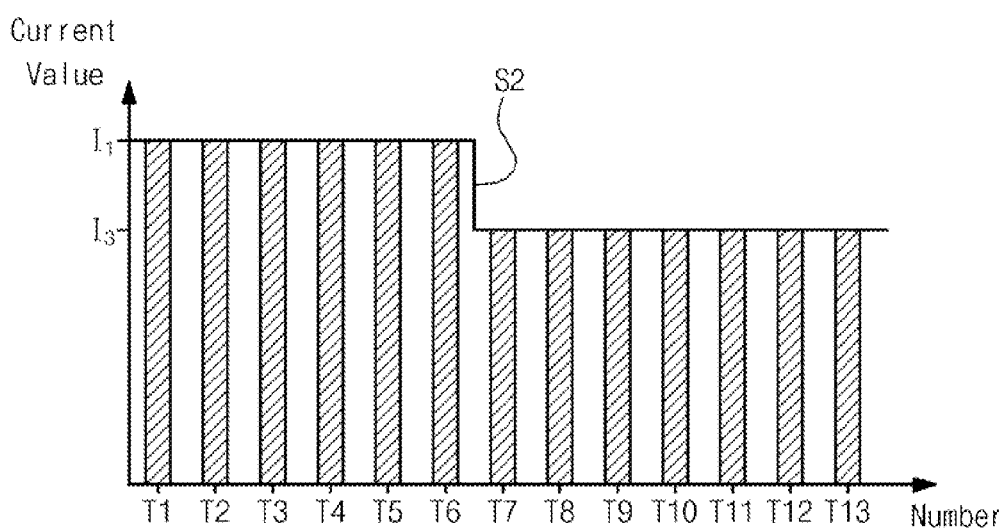

FIGS. 4A and 4B are views illustrating a calculation process of X and Y coordinates of a second touch using a touch sensing apparatus.

Referring to FIGS. 4A and 4B, when the second touch TP2 occurs on a different position from the first touch TP1 in the light distribution part 30, a second shadow area SA2 of which the touch position of the second touch TP2 is defined as a vertex is generated. The second shadow area SA2 has an intensity of light less than that of an area surrounding the second shadow area SA2. Since the second shadow area SA2 is generated, a third current value I3 output from each of the seventh to thirteenth light sensing devices T7 though T13 is smaller than a first current value I1 output from each of the first to sixth light sensing devices T1 through T6.

Accordingly, the coordinate generating part 35 receives a second output signal S2 output from each of the first to thirteenth light sensing devices T1 through T13 and groups the seventh to thirteenth light sensing devices T7 through T13, each from which the third current value I3 is output into one light sensing device group. Then, the coordinate generating part 35 outputs an X-axis coordinate value X2 of the second touch TP2 by using a center value of X-axis direction corresponding to the light sensing device group as an X-axis coordinate value of the second touch.

In addition, the coordinate generating part 35 outputs a Y-axis coordinate Y2 of the second touch TP2 after outputting the X-axis coordinate X2. In detail, before the second touch TP2 occurs, each of the first to thirteenth light sensing devices T1 through T13 outputs the first current value I1, but each of the seventh to thirteenth light sensing devices T7 though T13 outputs the third current value I3 smaller than the first current value I1 after the second touch TP2 occurs. The number of the light sensing devices that outputs the third current value I3 in response to the second touch TP2 is seven and a second variation of the current value output from each of the seven light sensing devices is the same as a value obtained by subtracting the third current value I3 from the first current value I1.

Accordingly, the coordinate generating part 35 may calculate the Y-axis coordinate Y1 of the second touch TP2 based on the number of the light sensing devices that outputs the third current value I3 in response to the second touch TP1 and the second variation of the current value output from each of the light sensing devices that output the third current value I3.

Figure 5A:
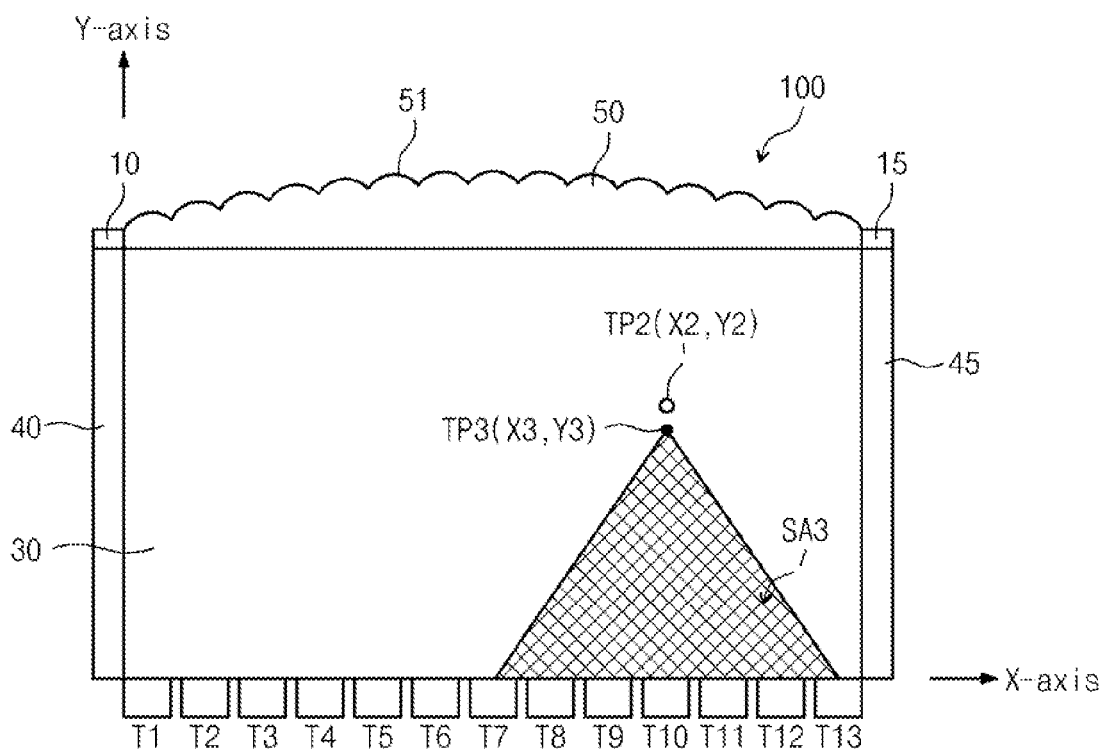
FIGS. 5A and 5B are views illustrating a calculation process of X and Y coordinates of a third touch using a touch sensing apparatus.
Figure 5B:
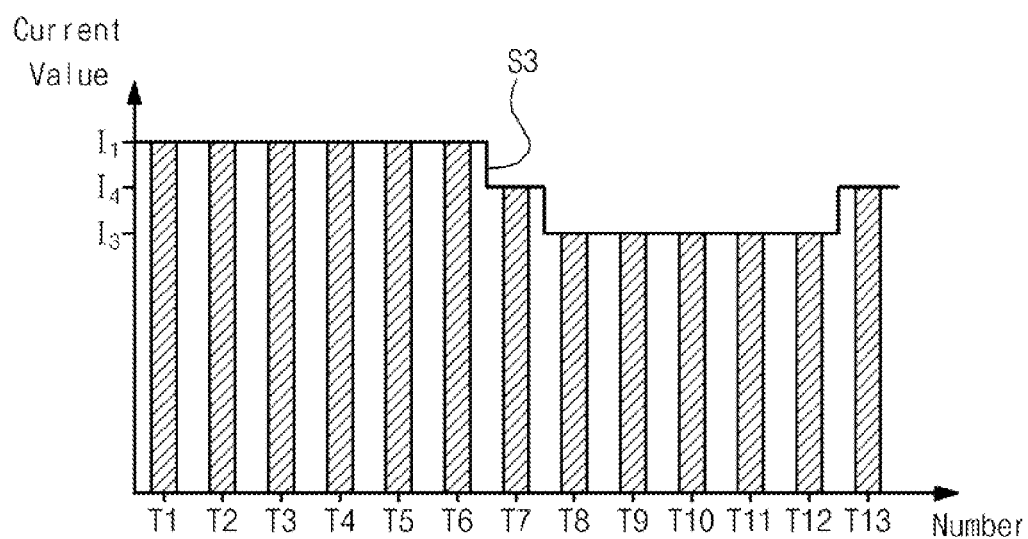

FIGS. 5A and 5B are views illustrating a calculation process of X and Y coordinates of a third touch using a touch sensing apparatus. In FIG. 5, the third touch TP3 has the same X-axis coordinate as that of the second touch TP2 shown in FIGS. 4A and 4B, and thus detailed description for calculating the X-axis coordinate of the third touch TP3 will be omitted.

Referring to FIGS. 5A and 5B, when the third touch TP3 occurs in the light distribution part 30, a third shadow area SA3 of which the touch position of the third touch TP3 is defined as a vertex is generated. The coordinate generating part 35 calculates the X-axis X3 of the third touch TP3 as described with reference to FIGS. 4A and 4B.

Meanwhile, the third touch TP3 has a Y-axis coordinate similar to that of the second touch TP2. As a result, before the third touch TP3 occurs, each of the first to thirteenth light sensing devices T1 through T13 outputs the first current value I1, but each of the seventh to thirteenth light sensing devices T7 through T13 outputs the current value smaller than the first current value I1 after the third touch TP3 occurs. In detail, when the third touch TP3 occurs, each of the eighth to twelfth light sensing devices T8 through T12 outputs a third current value I3 and each of the seventh and thirteenth light sensing devices T7 and T13 outputs a fourth current value I4 larger than the third current value I3.

Referring to FIGS. 4A and 4B, after the second touch TP2 occurs, the current value output from each of the seven light sensing devices T7 through T13 decreases from the first current value I1 to the third current value I3. The variation of the current value output from each of the seven light sensing devices T7 through T13 is uniform.

Referring to again FIGS. 5A and 5B, similar to when the second touch TP2 occurs, the current value output from each of the seven light sensing devices T7 through T13 decreases after the third touch TP3 occurs, but the variation of the current value output from at least one light sensing device among the seven light sensing devices T7 through T13 may be different from the variation of the current value output from remaining light sensing devices among the seven light sensing devices T7 through T13. This is because the seventh and thirteenth light sensing devices T7 and T13 are partially covered by the third shadow area SA3.

Accordingly, when assuming that the variation of the current value output from each of the seventh and thirteenth light sensing devices T7 and 113 corresponding to the third touch T3 is referred to as a first variation amount and the variation of the current value output from each of the eighth to twelfth light sensing devices T8 through T12 is referred to as a second variation amount, the second variation amount is greater than the first variation amount. As a result, the coordinate generating part 35 may calculate the Y-axis coordinate Y3, which is different from the Y-axis coordinate Y2 of the second touch TP2, based on the number of the light sensing devices that outputs the current value that is reduced from the first current value I1 in response to the third touch TP3 and the variation of the current value output from each of the light sensing devices.

Figure 6A:
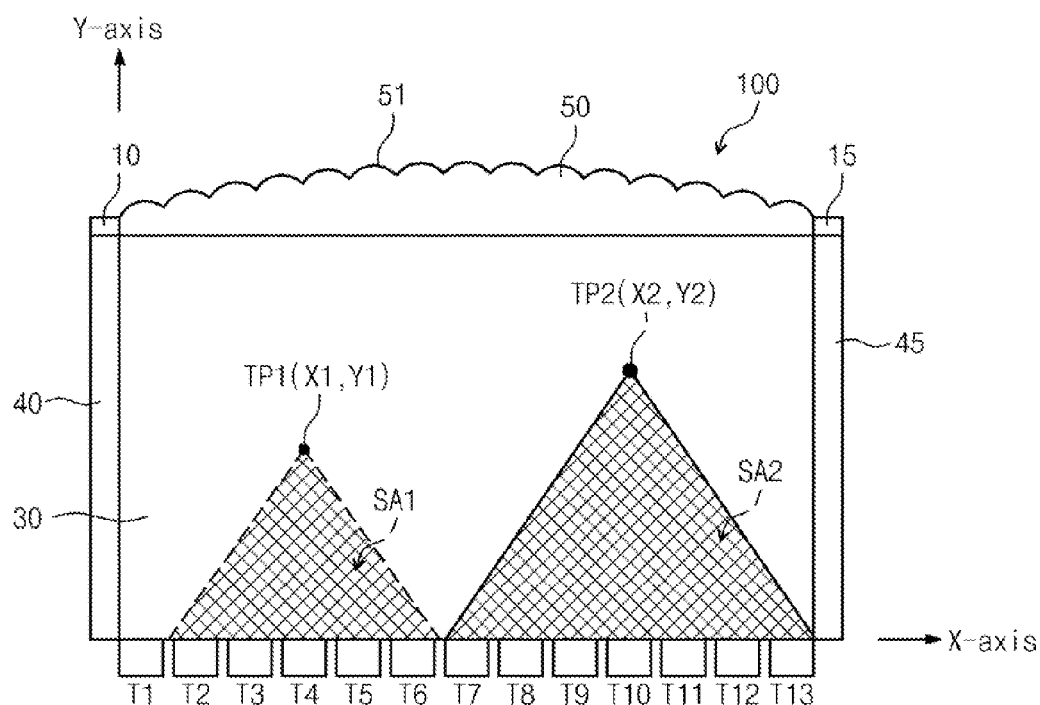
FIGS. 6A and 6B are views illustrating a calculation process of X and Y coordinates of first and second touches that occur substantially simultaneously using a touch sensing apparatus.
Figure 6B:
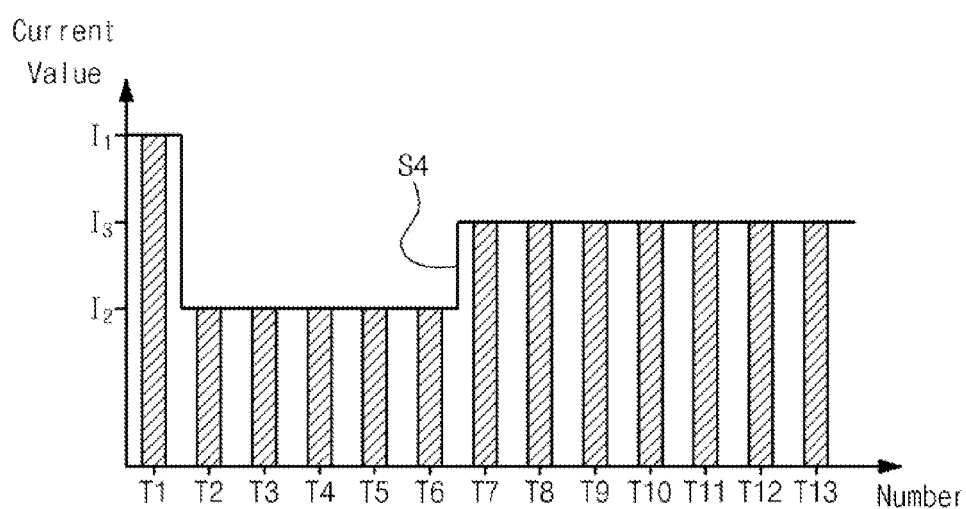

FIGS. 6A and 6B are views illustrating a calculation process of X and Y coordinates of first and second touches that occur substantially simultaneously using a touch sensing apparatus.

Referring to FIGS. 6A and 6B, when the first and second touches TP1 and TP2 occur at different positions in the light distribution part 30, a first shadow area SA1 is generated corresponding to the first touch TP1 and a second shadow area SA2 is generated corresponding to the second touch TP2. As a result, the coordinate generating part 35 may calculate the X-axis X1 of the first touch TP1 and the X-axis of the second touch TP2 based on the number of the light sensing devices included in a first light sensing device group T2 through T6 that output the reduced current value corresponding to the first shadow area SA1 and the number of the light sensing devices included in a second light sensing device group T7 through T13 that output the reduced current value corresponding to the second shadow area SA2.

In addition, the coordinate generating part 35 may calculate the Y-axis Y1 of the first touch TP1 based on the number of the light sensing devices included in the first light sensing device group T2 through T6 that output the reduced current value corresponding to the first shadow area SA1 and the variation of the current value output from each of the light sensing devices T2 through T6 included in the first light sensing device group T2 though T6. Similarly, the coordinate generating part 35 may calculate the Y-axis Y2 of the second touch TP2 based on the number of the light sensing devices included in the second light sensing device group T7 through T13 that output the reduced current value corresponding to the second shadow area SA2 and the variation of the current value output from each of the light sensing devices T7 through T13 included in the first light sensing device group T7 though T13.

Figure 7:
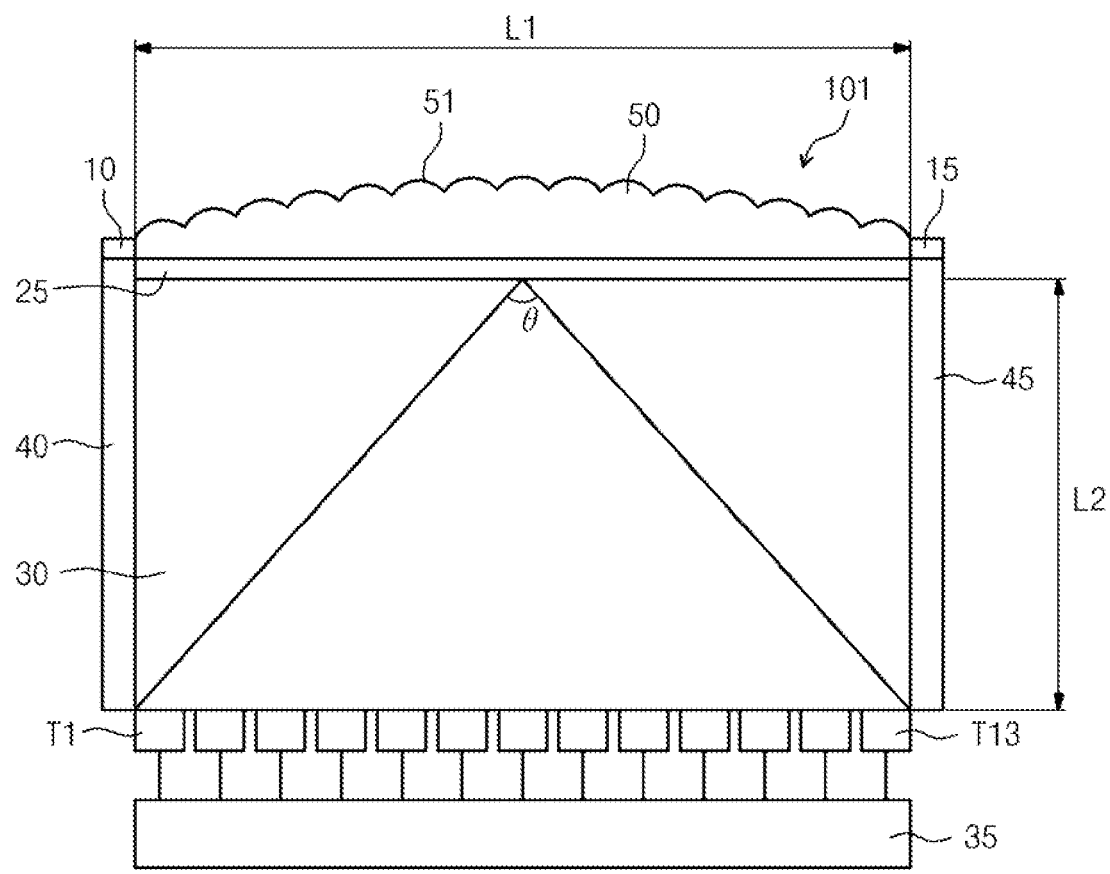
FIG. 7 is a plan view showing a touch sensing apparatus according to an exemplary embodiment of the present invention.

FIG. 7 is a plan view showing a touch sensing apparatus according to an exemplary embodiment of the present invention. In FIG. 7, the same reference numerals may denote the same elements in FIG. 1, and thus detailed descriptions of the same elements will be omitted.

Referring to FIG. 7, a touch sensing apparatus 101 includes a first light source 10, a second light source 15, a light distribution part 30, a first light reflection part 40, a second light reflection part 45, a light guide part 50, light sensing devices T1 through T13, a coordinate generating part 35, and a diffusion member 25. The diffusion member 25 is located at between the light guide part 50 and the light distribution part 30 and diffuses the light guided to the light distribution part 30 from the light guide part 50.

Since the touch sensing apparatus 101 senses the touch by using the variation in the intensity of the light received to the light sensing devices T1 through T13, the light distribution part 30 has a uniform light intensity over the entire light distribution part. Accordingly, the light being guided by the light guide part 50 and traveling to the light distribution part 30 has the same exit angle 2θ with respect to the diffusion member 25. Accordingly, the distribution of the light may be uniform in the entire light distribution part 30.

To this end, when assuming that a length of the long side of the light distribution 30 is referred to as a first length L1 and a length of the short side of the light distribution 30 is referred to as a second length L2, the exit angle 2θ of the light guided by the light guide part 50 satisfies the following Equation.

$$2\theta = 2 \times \operatorname{Tan}^{-1}(L1/2 \times L2) \quad \text{Equation}$$

In addition, the exit angle 2θ of the light may be adjusted by the diffusion member 25 to satisfy the above equation.

Figure 8:
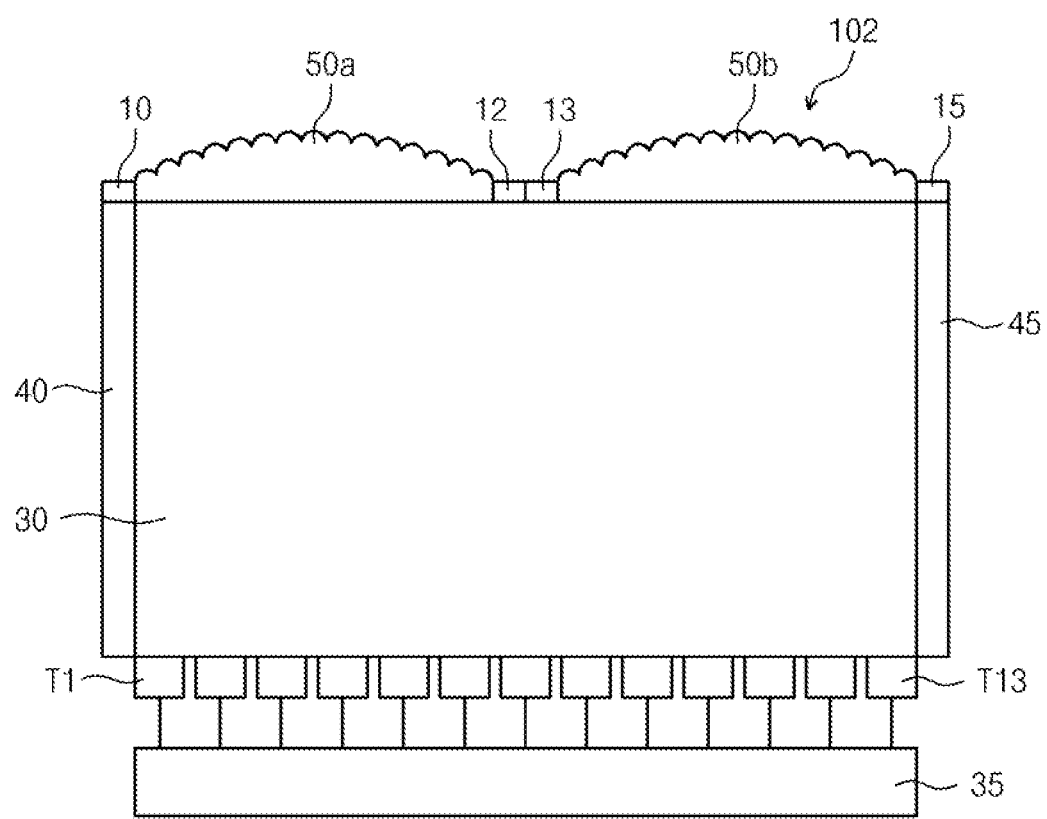
FIG. 8 is a plan view showing a touch sensing apparatus according to an exemplary embodiment of the present invention.

FIG. 8 is a plan view showing a touch sensing apparatus according to an exemplary embodiment of the present invention. In FIG. 8, the same reference numerals may denote the same elements in FIG. 1, and thus detailed descriptions of the same elements will be omitted.

Referring to FIG. 8, a touch sensing apparatus 102 includes first, second, third, and fourth light sources 10, 12, 13, and 15, a light distribution part 30, a first light reflection part 40, a second light reflection part 45, a first light guide part 50a, a second light guide part 50b, light sensing devices T1 through T13, and a coordinate generating part 35.

In a plan view, the first and second light guide parts 50a and 50b are sequentially arranged along an upper side of the light distribution part 30. The first and second light sources 10 and 12 are arranged to face each other while interposing the first light guide part 50a therebetween so that the first and second light sources 10 and 12 may provide the light to the first light guide part 50a. In addition, the third and fourth light sources 13 and 15 are arranged to face each other while interposing the second light guide part 50b therebetween so that the third and fourth light sources 13 and 15 may provide the light to the second light guide part 50b. Thus, the exit angle of the light guided to the light distribution part 30 may be easily controlled by the first and second light guide parts 50a and 50b and the distribution of the light may be uniform over the entire light distribution part 30.

Figure 9:
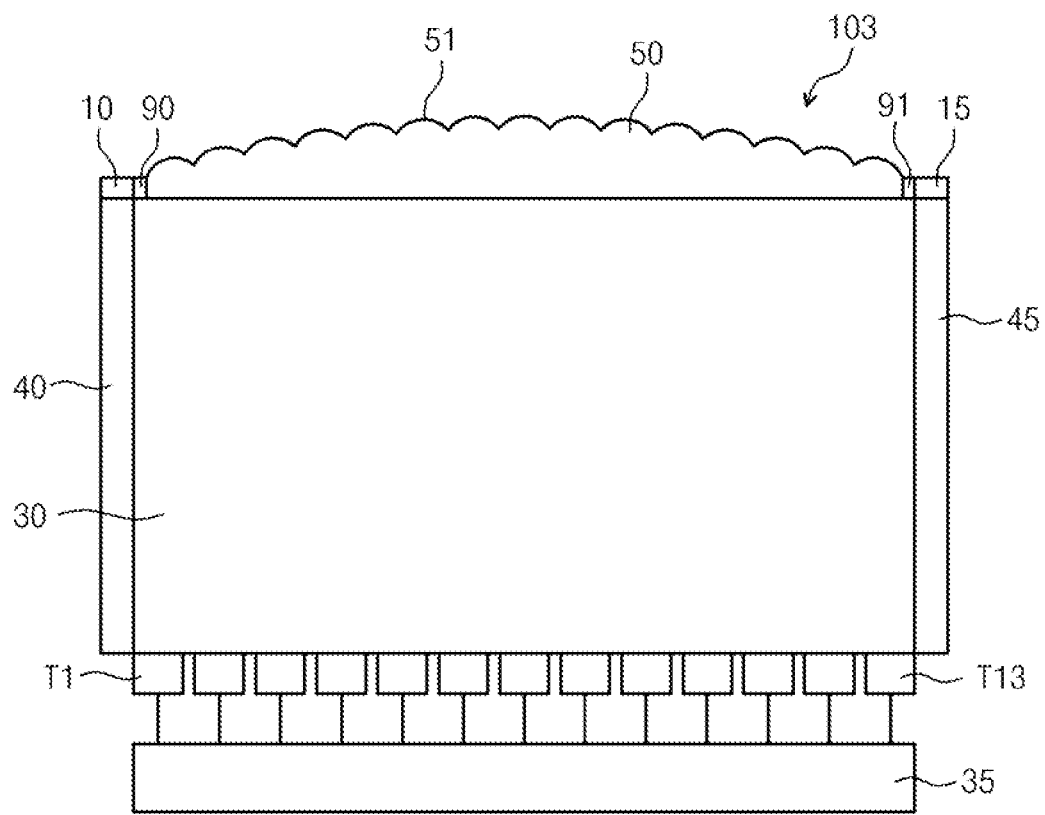
FIG. 9 is a plan view showing a touch sensing apparatus according to an exemplary embodiment of the present invention.

FIG. 9 is a plan view showing a touch sensing apparatus according to an exemplary embodiment of the present invention. In FIG. 9, the same reference numerals may denote the same elements in FIG. 1, and thus detailed descriptions of the same elements will be omitted.

Referring to FIG. 9, a touch sensing apparatus 103 includes first and second light sources 10 and 15, a light distribution part 30, a first light reflection part 40, a second light reflection part 45, a light guide part 50, light sensing devices T1 through T13, a coordinate generating part 35, a first lens 90, and a second lens 91.

In a plan view, the first lens 90 is located between the first light source 10 and the light guide part 50 and the second lens 91 is located between the second light source 15 and the light guide part 50. The first and second lenses 90 and 91 may be convex lenses and may collect the light provided from the first and second light sources 10 and 15, respectively. As a result, the light being generated by the first and second light sources 10 and 15 and traveling to the light guide part 50 may be collected by the first and second lenses 90 and 91, respectively, thereby preventing a reduction in the intensity of the light used to sense the touch on the touch sensing apparatus 103.

Figure 10:
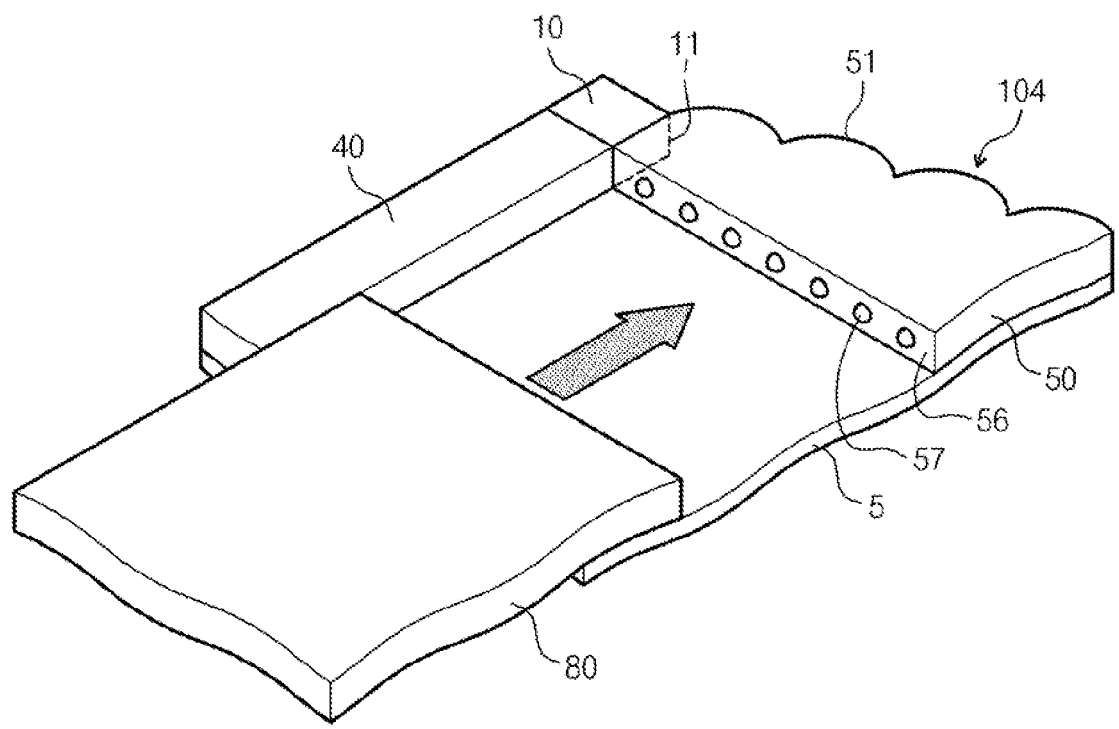
FIG. 10 is a perspective view showing a touch sensing apparatus according to an exemplary embodiment of the present invention.

FIG. 10 is a perspective view showing a touch sensing apparatus according to an exemplary embodiment of the present invention. In FIG. 10, the same reference numerals may denote the same elements in FIG. 2B, and thus detailed descriptions of the same elements will be omitted.

Referring to FIG. 10, a touch sensing apparatus 104 has the structure and function substantially same as those of the touch sensing apparatus 100 shown in FIG. 2B and further includes a light guide plate 80 positioned at the area of the light distribution part 30 shown in FIG. 2B. As a result, the light guided by the light guide part 50 is provided to the light guide plate 80 through the exit surface 56 and the light provided to the light guide plate 80 are reflected by the light guide plate 80 to travel to the light sensing devices T1 through T13.

Unlike how the touch occurs in the light distribution part 30 of the touch sensing apparatus 100 shown in FIG. 2B, here, the touch occurs on the light guide plate 80 of the touch sensing apparatus 104. When the touch occurs on the light guide plate 80, portions of the light passing through the light guide plate 80 are absorbed by the touch and the light sensing devices may output the output signals corresponding to the absorbed light intensity.

Figure 11:
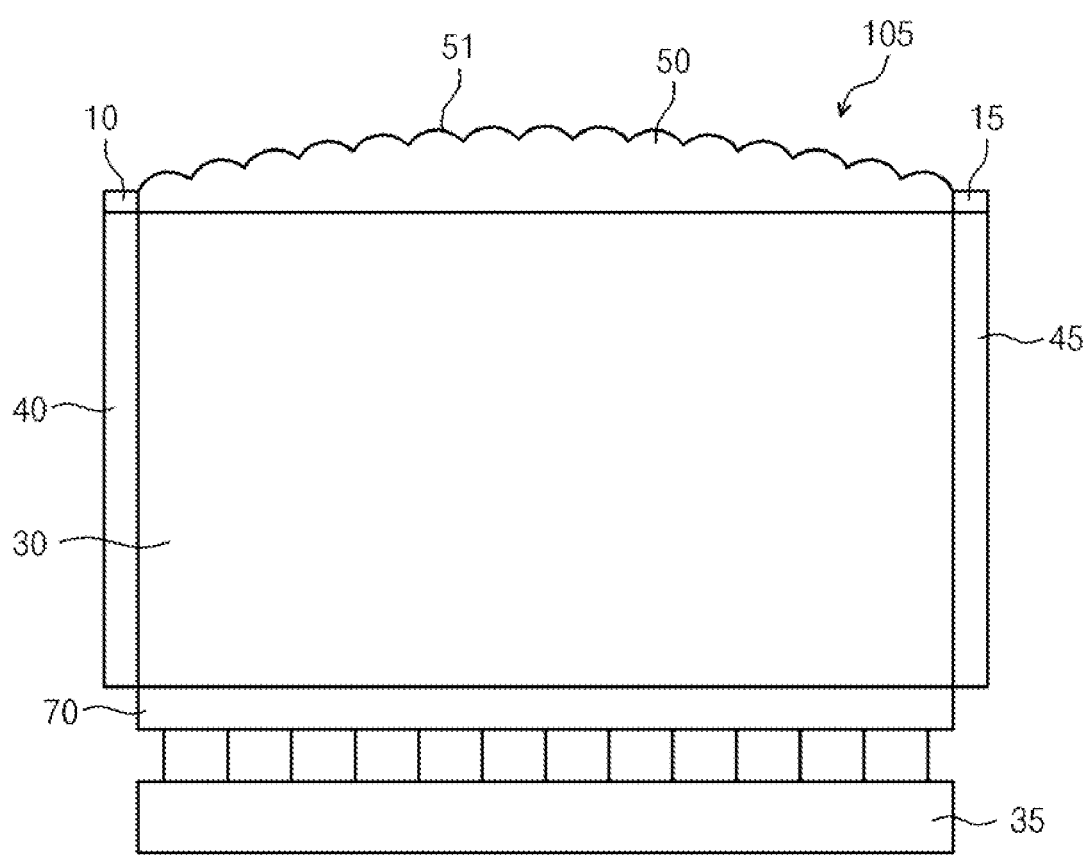
FIG. 11 is a plan view showing a touch sensing apparatus according to an exemplary embodiment of the present invention.

In addition, although not shown in FIG. 10, the light sensing devices T1 through T13 may be replaced with a linear charge-coupled device arranged along a side of the light guide plate as shown in FIG. 11.

FIG. 11 is a plan view showing a touch sensing apparatus according to an exemplary embodiment of the present invention. In FIG. 11, the same reference numerals may denote the same elements in FIG. 1 and thus detailed descriptions of the same elements will be omitted.

Referring to FIG. 11, a touch sensing apparatus 105 includes a first light source 10, a second light source 15, a light distribution part 30, a first light reflection part 40, a second light reflection part 45, a light guide part 50, a light sensing part, and a coordinate generating part 35. The light sensing part includes a linear charge-coupled device 70.

In a plan view, the linear charge-coupled device 70 is arranged adjacent to a side of the light distribution part 30 to face the light guide part 50. The linear charge-coupled device 70 senses the light provided from the light guide part 50 through the light distribution part 30 to output signals corresponding to the sensed light intensity.

As described above, when the touch sensing apparatus 105 includes the linear charge-coupled device 70, a light receiving rate of the light sensing part 70 that receives the light provided from the first and second light sources 10 and 15 through the light guide part 50 and the light distribution part 30 may be increased, to thereby make the sensing function of the touch sensing apparatus 105 more sensitive.

Figure 12:
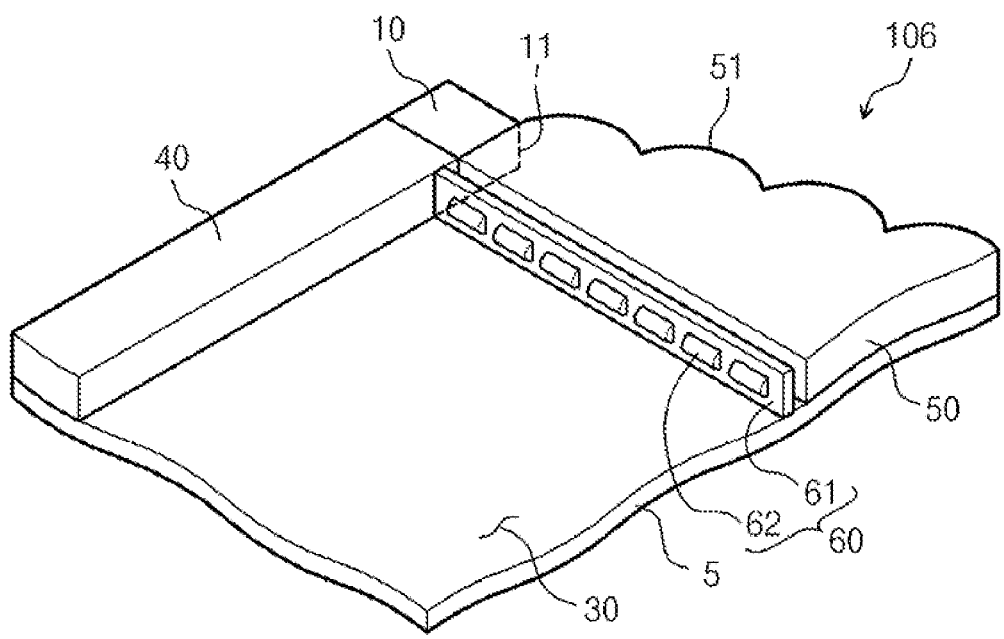
FIG. 12 is a perspective view showing a touch sensing apparatus according to an exemplary embodiment of the present invention.

FIG. 12 is a perspective view showing a touch sensing apparatus according to an exemplary embodiment of the present invention. In FIG. 12, the same reference numerals may denote the same elements in FIGS. 1 and 2B, and thus detailed descriptions of the same elements will be omitted.

As shown in FIG. 12, a touch sensing apparatus 106 further includes an auxiliary light guide part 60 compared with the touch sensing apparatus 100 shown in FIGS. 1 and 2B.

The auxiliary light guide part 60 is disposed on the plate 5 to face the exit surface of the light guide part 50. Here, the auxiliary light guide part 60 may be arranged spaced apart from the light guide part 50, and protrusion patterns 62 each having a semi-cylinder shape may be protruded from an exit surface 61 of the auxiliary light guide part 60. Each of the protrusion patterns 62 may condense the light, acting as a convex lens. Thus, the protrusion patterns 62 may prevent the light exiting through the exit surface 61 from being scattered upward of the light distribution part 30.

Although exemplary embodiments of the present invention have been described, it is understood that the present invention should not be limited to these exemplary embodiments but various changes and modifications can be made by one of ordinary skilled in the art within the spirit and scope of the present invention.

What is claimed is:

1. A touch sensing apparatus comprising:
   at least one light source generating light;
   a light distribution part in which the light from the light source is distributed;
   a light guide part, including a light reflection part, that guides the light from the light source to the light distribution part by reflecting the light;
   a light sensing part that faces the light guide part receiving the light provided through the light guide part and the light distribution part from the light source, and outputting an output signal corresponding to a degree to which an intensity of the received light varies along the light sensing part as a result of a first touch occurring in the light distribution part; and
   a coordinate generating part that calculates a coordinate value of the first touch based on the output signal from the light sensing part,
   wherein the coordinate generating part calculates an X-axis coordinate value of the first touch as a center value of a plurality of light sensing devices arranged along a longitudinal direction of the light guide part exhibiting a variation of output values and calculates a Y-axis coordinate value of the first touch from a number of light sensing devices of the plurality of light sensing devices exhibiting a variation of output value.

2. The touch sensing apparatus of claim 1, wherein the light sensing part comprises the plurality of light sensing devices arranged along the longitudinal direction of the light guide part and the light guided to the light distribution part by the light guide part travels in a direction inclined with respect to the longitudinal direction of the light guide part.

3. The touch sensing apparatus of claim 2, wherein a shadow area is generated in the light distribution part in response to the first touch and the light sensing devices of the light sensing part generate the output signal in response to a decrease in the intensity of the received light is reduced by the shadow area.

4. The touch sensing apparatus of claim 3, wherein the coordinate generating part defines a first light sensing device group, from among the plurality of light sensing devices, of which the output signal is varied by the first touch among the light sensing devices, and calculates the center value of the X-axis direction corresponding to the first light sensing device group as an X-axis coordinate value of the first touch, and the coordinate generating part obtains a number of the light sensing devices of the first light sensing device group and a variation of the output signal from each light sensing device of the first light sensing device group to calculate a Y-axis coordinate value of the first touch.

5. The touch sensing apparatus of claim 4, wherein the number of the light sensing devices in the first light sensing device group increases as the first touch is closer to the light guide part.

6. The touch sensing apparatus of claim 4, wherein the variation of the output signal from each light sensing device in the first light sensing device group increases as the first touch is closer to the light sensing devices.

7. The touch sensing apparatus of claim 4, wherein the coordinate generating part defines a second light sensing device group, from among the plurality of light sensing devices, of which the output signal is varied by a second touch substantially simultaneously generated with the first touch and calculates a center value of an X-axis direction corresponding to the second light sensing device group as an X-axis coordinate value of the second touch, and the coordinate generating part obtains a number of the light sensing devices of the second light sensing device group and a variation of the output signal from each light sensing device of the second light sensing device group to calculate a Y-axis coordinate value of the first touch.

8. The touch sensing apparatus of claim 2, wherein the light guide part comprises:
an incident surface to which the light from the light source is incident, the incident surface facing the light source;
an exit surface from which the light from the light source exits, the exit surface facing the light distribution part; and
a light guide pattern protruding from a surface opposite to the exit surface and guiding the light from the light source such that the light from the light source travels to the light distribution part through the exit surface.

9. The touch sensing apparatus of claim 8, wherein the height of the protrusions of the light guide pattern are within a range from about 34 micrometer to about 45 micrometer.

10. A touch sensing apparatus comprising:
at least one light source generating light;
a light distribution part in which the light from the light source is distributed;
a light guide part, including a light reflection part, that guides the light from the light source to the light distribution part by reflecting the light;
a light sensing part that faces the light guide part receiving the light provided through the light guide part and the light distribution part from the light source, and outputting an output signal corresponding to a degree to which an intensity of the received light varies along the light sensing part as a result of a first touch occurring in the light distribution part; and
a coordinate generating part that calculates a coordinate value of the first touch based on the output signal from the light sensing part,
wherein the light sensing part comprises a plurality of light sensing devices arranged along a longitudinal direction of the light guide part and the light guided to the light distribution part by the light guide part travels in a direction inclined with respect to the longitudinal direction of the light guide part,
wherein the light guide part comprises:
an incident surface to which the light from the light source is incident, the incident surface facing the light source;
an exit surface from which the light from the light source exits, the exit surface facing the light distribution part; and
a light guide pattern protruding from a surface opposite to the exit surface and guiding the light from the light source such that the light from the light source travels to the light distribution part through the exit surface,
wherein the light guide part comprises a first side adjacent to the light distribution part and having a straight shape, a second side opposite to the first side and having a round shape, and a width gradually decreasing from a center of the light guide part to first and second sides thereof.

11. The touch sensing apparatus of claim 10, wherein a shadow area is generated in the light distribution part in response to the first touch and the light sensing devices of the light sensing part generate the output signal in response to a decrease in the intensity of the received light is reduced by the shadow area.

12. The touch sensing apparatus of claim 11, wherein the coordinate generating part defines a first light sensing device group, from among the plurality of light sensing devices, of which the output signal is varied by the first touch among the light sensing devices, and calculates a center value of an X-axis direction corresponding to the first light sensing device group as an X-axis coordinate value of the first touch, and the coordinate generating part obtains a number of the light sensing devices of the first light sensing device group and a variation of the output signal from each light sensing device of the first light sensing device group to calculate a Y-axis coordinate value of the first touch.

13. The touch sensing apparatus of claim 12, wherein the number of the light sensing devices in the first light sensing device group increases as the first touch is closer to the light guide part.

14. The touch sensing apparatus of claim 12, wherein the variation of the output signal from each light sensing device in the first light sensing device group increases as the first touch is closer to the light sensing devices.

15. The touch sensing apparatus of claim 12, wherein the coordinate generating part defines a second light sensing device group, from among the plurality of light sensing devices, of which the output signal is varied by a second touch substantially simultaneously generated with the first touch and calculates a center value of an X-axis direction corresponding to the second light sensing device group as an X-axis coordinate value of the second touch, and the coordinate generating part obtains a number of the light sensing devices of the second light sensing device group and a variation of the output signal from each light sensing device of the second light sensing device group to calculate a Y-axis coordinate value of the first touch.

16. The touch sensing apparatus of claim 12, wherein the coordinate generating part defines a second light sensing device group, from among the plurality of light sensing devices, of which the output signal is varied by a second touch substantially simultaneously generated with the first touch and calculates a center value of an X-axis direction corresponding to the second light sensing device group as an X-axis coordinate value of the second touch, and the coordinate generating part obtains a number of the light sensing devices of the second light sensing device group and a variation of the output signal from each light sensing device of the second light sensing device group to calculate a Y-axis coordinate value of the first touch.

17. A touch sensing apparatus comprising:
at least one light source generating light;
a light distribution part in which the light from the light source is distributed;
a light guide part, including a light reflection part, that guides the light from the light source to the light distribution part by reflecting the light;
a light sensing part that faces the light guide part receiving the light provided through the light guide part and the light distribution part from the light source, and outputting an output signal corresponding to a degree to which an intensity of the received light varies along the light sensing part as a result of a first touch occurring in the light distribution part; and
a coordinate generating part that calculates a coordinate value of the first touch based on the output signal from the light sensing part, wherein the light guide part comprises a first side adjacent to the light distribution part and having a straight shape, a second side opposite to the first side and having a round shape, and a width gradually decreasing from a center of the light guide part to first and second sides thereof.

18. The touch sensing apparatus of claim 17, wherein the light sensing part comprises a plurality of light sensing devices arranged along a longitudinal direction of the light guide part and the light guided to the light distribution part by the light guide part travels in a direction inclined with respect to the longitudinal direction of the light guide part.

19. The touch sensing apparatus of claim 18, wherein a shadow area is generated in the light distribution part in response to the first touch and the light sensing devices of the light sensing part generate the output signal in response to a decrease in the intensity of the received light is reduced by the shadow area.

20. The touch sensing apparatus of claim 19, wherein the coordinate generating part defines a first light sensing device group, from among the plurality of light sensing devices, of which the output signal is varied by the first touch among the light sensing devices, and calculates a center value of an X-axis direction corresponding to the first light sensing device group as an X-axis coordinate value of the first touch, and the coordinate generating part obtains a number of the light sensing devices of the first light sensing device group and a variation of the output signal from each light sensing device of the first light sensing device group to calculate a Y-axis coordinate value of the first touch.

* * * * *